United States Patent [19]

Corton et al.

[11] Patent Number: 5,171,961
[45] Date of Patent: Dec. 15, 1992

[54] MONITORING WELD VOLTAGE

[75] Inventors: Anthony D. Corton; Andrew J. Boyd, both of Wantage, United Kingdom

[73] Assignee: CMB Foodcan plc, Worcester, United Kingdom

[21] Appl. No.: 722,910

[22] Filed: Jun. 28, 1991

[30] Foreign Application Priority Data

Jun. 30, 1990 [GB] United Kingdom ............... 9014607

[51] Int. Cl.⁵ ............................................. B23K 11/25
[52] U.S. Cl. ....................................... 219/109; 219/64
[58] Field of Search ................................. 219/109, 64

[56] References Cited

U.S. PATENT DOCUMENTS 4,714,816 12/1987 Pazzaglia ............................ 219/109
4,939,335 7/1990 Mueller ............................... 219/109

FOREIGN PATENT DOCUMENTS 0014271 8/1980 European Pat. Off. .
0345473 5/1989 European Pat. Off. .

Primary Examiner—Clifford C. Shaw
Attorney, Agent, or Firm—Christie, Parker & Hale

[57] ABSTRACT

A seam weld machine includes a voltage monitoring circuit (9) for determining weld quality. The voltage is sensed by two pick-ups. A first pick-up is in the form of a conductive rider (10), mounted to directly sense the voltage from a weld wire (4). The wire (8) from the second pick-up is short and is fed through a gap in the z-bar (6) of the machine to emerge close to the wire from the first pick-up, thus reducing electromagnetic interference and noise.

8 Claims, 2 Drawing Sheets

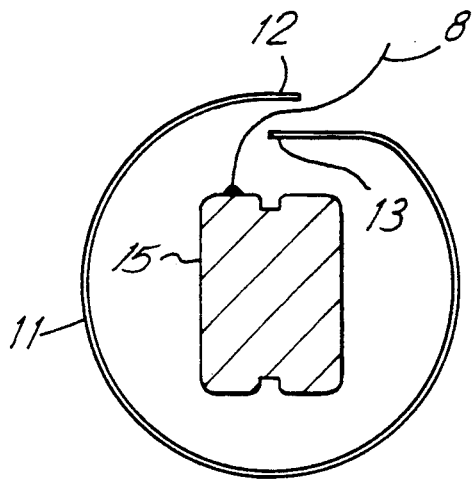
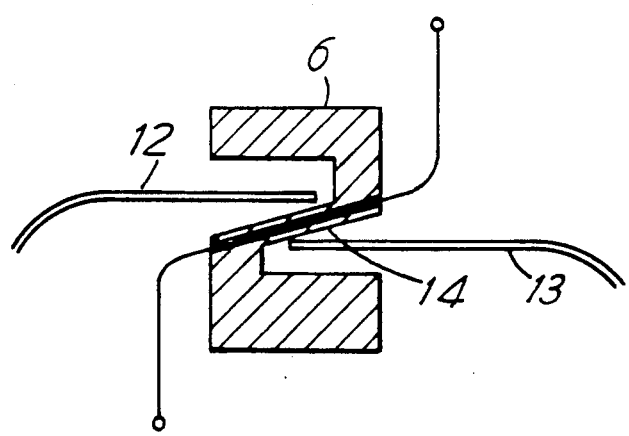

MONITORING WELD VOLTAGE

BACKGROUND

This invention relates to monitoring weld voltages. In particular, it relates to monitoring the voltages produced in AC resistance welding of the longitudinal seams of tubular 3-piece cans.

The longitudinal seams of 3-piece cans are often welded in machines in which the piece of metal forming the can body is folded such that its ends overlap and pushed along a member known as a z-bar or z-rail, into a welding position between two rollers. The z-bar serves, along its length, to bring the overlapping portions closer together and to control the degree of overlap. Copper or other welding wires are supported around each roller and are used as electrodes. An AC current is applied to the electrodes and welds the seams of the can body together in a series of spaced but overlapping weld nuggets, due to the AC voltage applied to the electrodes. Typical machines of this type are manufactured by SOUDRONIC AG, Switzerland, under their series designation FBB.

In order to determine the quality of welds it is desirable to monitor the voltage at the electrodes or the power absorbed by each weld nugget. Typical power monitors calculate an average power value for each nugget by monitoring the voltage and current in the welding circuit, multiplying these two wave forms and then, typically, integrating the results of a current cycle or more. A measure of the average power absorbed by each weld nugget is derived from this integration and this measure may be used to determine whether the weld has been successful or not. Clearly, if a weld has not been successful then the voltage and/or the power measured will be different. Such monitors are well known and typical ones include the CMB Engineering (Automation and Controls) models WM1, and M800. The voltage is generally monitored between one pick-up point adjacent the lower roller and a second pick-up point on the gimbal to which the upper weld roller is connected.

Two problems arise from this. Firstly, the voltage pick-up on the gimbal connected to the upper roller is remote from the actual electrode wire and hence does not truly measure the voltage which is passed through the overlapping seams on the can or other body. Errors can also arise by virtue of the rotating action of the roller. Secondly, the wire pick-up connected to the lower roller is passed along the length of the z-bar and emerges from its far end from whence a relatively long wire extends to the monitoring apparatus. Now, since the wire is relatively long and is in the vicinity of relatively high currents (typically around 4 kA rms) and is in effect a loop of wire present within this varying field, then electromagnetic induction occurs and the wire picks up noise and other interference.

BRIEF SUMMARY OF THE INVENTION

According to the present invention there is provided apparatus for monitoring the voltage of an AC resistance welding apparatus comprising a welding roller and a welding wire extending around at least part of the welding roller, wherein a voltage sensor is adapted to sense voltage directly at the welding wire.

Preferably, the voltage sensor is a conducting rider adapted to contact the moving wire. The rider may be of a ceramic material, such as a nickel-matrix tungsten carbide.

According to the inventor there is further provided apparatus for monitoring the voltage of an AC resistance welding apparatus comprising an electrode roller and an elongate z-bar adapted to carry a body to be welded into an operative welding position adjacent the roller, which voltage monitoring apparatus comprises a sensor arranged to sense a voltage dependent upon the voltage at the roller and a wire connecting the sensor and a voltage monitoring circuit, the wire extending through the z-bar in a direction, generally parallel to the diagonal cross-member of the z-bar.

A z-bar is generally made in two or three sections and includes a main portion and a tip portion, which is the portion nearest the roller. By feeding the wire, according to the invention, between the tip and the main portion adjacent to and parallel to the diagonal part of the z-bar the length of this monitoring wire can be considerably reduced compared to previous systems. This entails a corresponding reduction in electromagnetic induction and noise picked up by the wires.

It is alternatively possible to make a hole in a z-bar, by drilling or otherwise, through which the wire can extend.

Embodiments of the invention will now be described by way of example, with reference to the accompanying diagrammatic drawings, in which:

BRIEF DESCRIPTION OF THE FIGURES

FIG. 3 shows schematically a partial view from the right hand side of FIG. 2 and;

FIG. 4 shows the manner in which the lower monitoring wire is taken through the z-bar.

DETAILED DESCRIPTION OF ILLUSTRATED EMBODIMENTS

Figure 1:
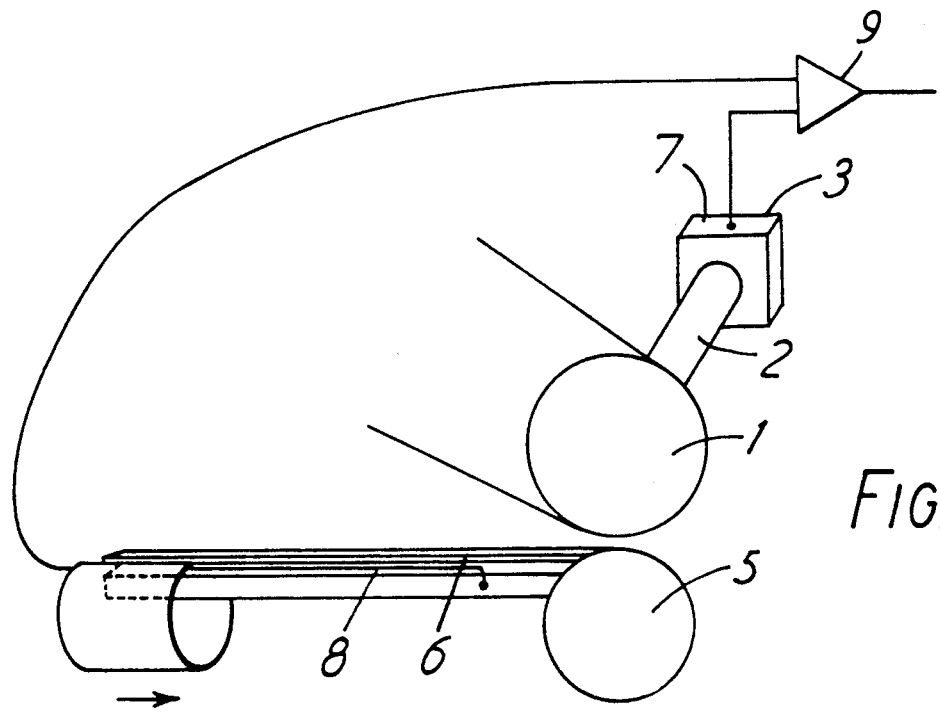
FIG. 1 shows a known voltage monitoring arrangement for a AC welding machine.

Referring to FIG. 1, a seam welding machine such as the SOUDRONIC FBB5501 includes an upper and a lower welding assembly. The upper welding assembly comprises a welding roller 1 connected to a rotating pendulum shaft 2 which is rotated with respect to gimbal 3. A copper welding wire 4 extends partially around welding roll 1 and acts as a sacrificial electrode to protect the welding roller. The lower welding roller assembly comprises a lower welding roller 5 and a lower welding wire (not shown). An elongate member 6 having a cross section in the shape of a 'Z', hence being called a z-bar, is used to feed planar sheets of metal to form cans or other tubular bodies into the nip between the respective rollers 1 and 5. The z-bar 6 is relatively long and typically comprises three portions; a rear portion, a central portion and a front tip portion. The front tip portion is generally detachable since it must be made of hard metal or other material which must be hard wearing. In use, a sheet of metal is positioned at the far end of the z-bar with its respective longitudinal edges which are to form the seam, each held by a respective recess portion of the 'Z'. The metal is then pushed along the z-bar by an arrangement of dogs and chains not forming part of the present invention. The z-bar is configured such that the respective ends are brought closer together and their overlap is carefully controlled before the metal plate is positioned between the nips of the rollers. By applying an AC current to the welding rolls the seam is welded in a pattern of weld nuggets as described above.

In order to monitor the weld voltage, a first pick-up 7 is positioned between the gimbal 3 and pendulum shaft 2. A second pick-up is placed on the welding arm connected to lower roller 5, which welding has been omitted from the drawing for clarity. Clearly, the cable or wire leading from this second pick-up has to trail along the length of the welding arm and emerge at a position beyond the furthest point of the z-bar from where it passes around the back of the machine before it can meet the pick-up cable from the first pick-up 7. Thus cable 8 is relatively long and a large pick-up loop is created, with concomitant problems of interference and electromagnetic induction. Both pick-up cables 7 and 8 are connected to respective inputs of a standard voltage monitoring circuit 9. This processes the potential difference between the two voltage monitors to evaluate the weld quality. A typical monitor of this sort is the CMB Engineering PMI monitor.

Figure 2:
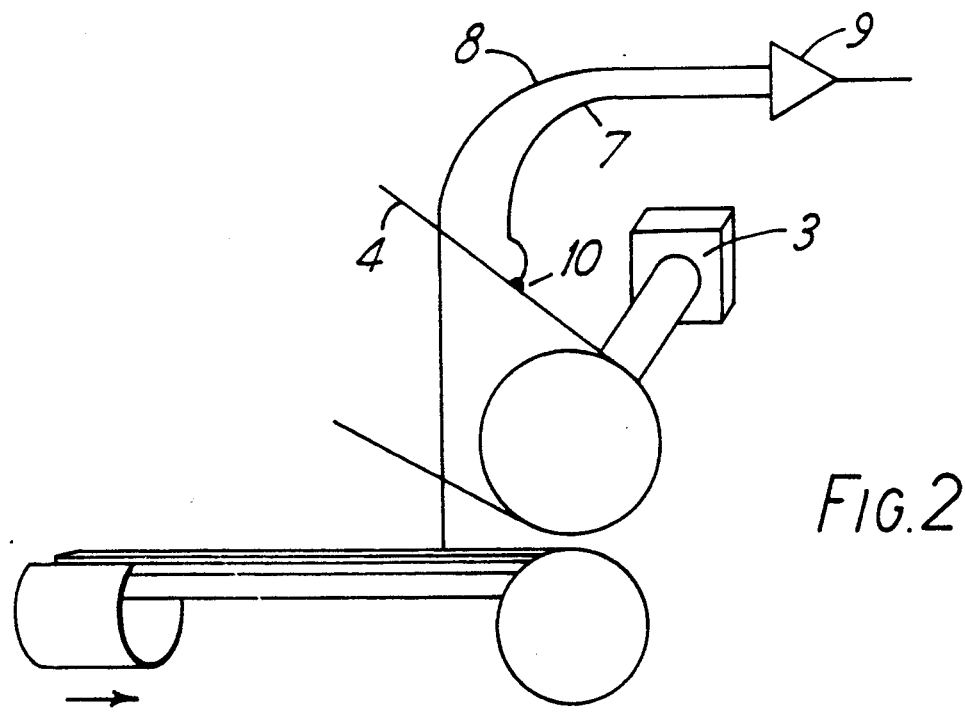
FIG. 2 shows a monitoring arrangement according to the present invention.

Referring to FIG. 2, in a monitoring apparatus according to the invention, the first pick-up 7 is moved from gimbal 3 and comprises a conducting ceramic rider 10 arranged to maintain a continuous contact with the conducting copper electrode wire 4. This removes the unwanted resistive and reactive voltages which are generated across the upper roll shaft and gimbal and which effect the voltage measured by the pick-up of FIG. 1. The ceramic material is typically a nickel-matrix tungsten carbide which has a high wear resistance and good conductivity. Alternatively, it may be made of any other suitable conducting ceramic or a metal.

The lower pick-up is maintained in the same position and measures the voltage at the same point on the lower arm. However, the cable, instead of extending along the length of the welding arm and beyond the back of the z-bar, is arranged to emerge through the gap between the overlapping portions of the can body when a can body passes. This is shown more clearly in FIG. 3 from which the z-bar has been omitted for clarity. In particular, FIG. 3 shows a lower welding arm 15 and a can body progressing longitudinally along the welding arm. Clearly, a cable cannot emerge from the bottom of the welding arm since it will at some stage be trapped and cut by a progressing can body member 11. Thus, the cable must emerge in the gap which will be present between the overlapping ends 12, 13 of the can as it passes the point at which the wire emerges. This may be done by passing the cable or wire 8 through the diagonal portion 14 of the z-bar, as shown in FIG. 4. In one example holes are drilled through the diagonal crosspiece of the z-bar so that a wire can be threaded through. Alternatively, and more conveniently, if the z-bar is of the type which is constructed in segments, it has been found possible to insert a 0.25 mm diameter wire between the end of the z-bar main portion and the z-bar tip when a standard 0.25 z-bar is used.

After emerging from the top of the z-bar the cable can be run to meet with the other cable at the upper welding roll. Alternatively, the first pick-up may be a conventional one mounted to gimbal 3 in which case the cable 8 after emerging from the z-bar meets cable 7 in the vicinity of the gimbal 3.

Since the wire passing between the z-bar and the z-bar tip, or through a z-bar, passes extremely close to the unwelded can edges and to the dogs and chain of the apparatus for moving a can, and to prevent breakage due to wrecks, rough handling or maintenance in the areas of the welding arm and z-bar, the wire is desirably enclosed in a flexible sheath of steel, other metals or plastics, for example. Since it passes through the z-bar area the wire will generally require a permanent fixing to eliminate the risk of it being sliced by a can edge as the can moves. The wire may be fixed in position, by an adhesive such as an epoxy adhesive such as Araldite (Trade Mark), to reduce the risk of damage during welding. More preferably, a 'Z' shaped spacer may carry the wire between the z-bar and tip, or a film of plastics or other material incorporating a foil wire may, for example, be attached to the rear of the z-bar tip. Other methods of fixing may be used.

When implementing the contact for cable 7 above the upper roll it is important that no debris from the wire or the contact is produced. If raw material is allowed to fall onto the can then the weld may well be affected. Furthermore, wire tension just after the upper roll often varies in production due to changes in weld temperature. It is therefore important that the contact assembly is immune to changes in wire tension. The ceramic material for the rider should preferably provide a low coefficient of friction and have a low resistivity.

It has been found that either, or both modifications to a standard voltage monitoring apparatus according to the present invention can provide significant improvements in the detection of contamination, welding shorting and notched blanks, i.e. when the can blanks have uneven or cut edges. Furthermore, greater resolution can be obtained for detecting weld temperature changes.

By using the welding wire 4 directly as the pick-up cable spurious readings due to effects of the gimbal and roller shaft welding and also to the rotating joints are reduced or eliminated.

A pick-up in the form of a conductive rider may alternatively, or in addition, be used with the welding wire of the lower welding assembly.

We claim:

1. An AC resistance welding apparatus for forming a longitudinal welded seam in the formation of a tubular body from a metal sheet, which apparatus comprises:

an elongate z-bar comprising a diagonal cross member and having means for locating edge portions of the sheet in progressively increasing overlapped relationship as the sheet moves from a first end of the z-bar to a second end thereof in a longitudinal direction along the z-bar with the edge portions in contact therewith, wherein the sheet is in the shape of the tubular body at the second end of the z-bar;

welding means including a roller for AC resistance welding the edge portions together when so overlapped by said z-bar, the roller being located at the second end of the tubular body when the sheet is a the second end of the z-bar; and a voltage monitoring means for monitoring the voltage of a weld formed by the welding means, the voltage monitoring means including a voltage monitoring circuit and a pair of connections connecting the voltage monitoring circuit electrically across the weld, a first of said connections being made electrically to said roller and passing to the exterior of the tubular body through the z-bar, in transverse relation to said longitudinal direction and in parallel relation with the diagonal cross member of the z-bar.

2. AC resistance welding apparatus as claimed in claim 1 wherein the z-bar has a separate tip portion, and the first connection comprises a wire extending between the z-bar and z-bar tip portion.

3. AC resistance welding apparatus as claimed in claim 2 wherein the wire is carried by a Z-shaped spacer between the z-bar and the z-bar tip.

4. AC resistance welding apparatus as claimed in claim 1 wherein the wire extends though a though-hole formed in the z-bar.

5. Apparatus as claimed in claim 4 wherein the voltage sensor is a conductive rider.

6. Apparatus as claimed in claim 5 wherein the voltage sensor is of a conductive ceramic material.

7. Apparatus as claimed in claim 5 wherein the voltage sensor is of nickel-matrix tungsten carbide.

8. AC resistance welding apparatus as claimed in claim 1 wherein the welding apparatus further comprises a second weld roller and a welding wire extending around at least part of the second weld roller, and wherein a second of said connections comprises a voltage sensor adapted to sense voltage directly at the welding wire.

* * * * *